United States Patent
Chiang

(10) Patent No.: US 10,074,424 B1
(45) Date of Patent: Sep. 11, 2018

(54) MEMORY DEVICE, SYSTEM AND OPERATING METHOD THEREOF

(71) Applicant: MACRONIX INTERNATIONAL CO., LTD., Hsinchu (TW)

(72) Inventor: Kuang-Hao Chiang, Taoyuan (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 15/483,000

(22) Filed: Apr. 10, 2017

(51) Int. Cl.
*G11C 5/06* (2006.01)
*G11C 13/00* (2006.01)

(52) U.S. Cl.
CPC ........ *G11C 13/0069* (2013.01); *G11C 13/004* (2013.01); *G11C 13/0064* (2013.01)

(58) Field of Classification Search
CPC .............. G11C 13/0069; G11C 13/004; G11C 13/0064
USPC ......................................................... 365/63
See application file for complete search history.

(56) References Cited

U.S. PATENT DOCUMENTS

| | | |
|---|---|---|
| 2012/0063196 A1 | 3/2012 | Kim et al. |
| 2013/0223131 A1 | 8/2013 | Takagi et al. |
| 2014/0321196 A1 | 10/2014 | Ikeda et al. |
| 2015/0228334 A1 | 8/2015 | Nazarian et al. |
| 2015/0248930 A1 | 9/2015 | Lee et al. |
| 2016/0064083 A1* | 3/2016 | Nam ................. G11C 16/10 365/185.11 |
| 2017/0186489 A1* | 6/2017 | Kim .................. G11C 16/10 |

OTHER PUBLICATIONS

Rick Merritt: "3D XPoint Steps Into the Light"; EE Times; Connecting the Global Electronics Community; Jan. 14, 2016; pp. 1-3.
"The Wait Is Over! 3D XPOINT™ Technology"; Memory Technologies Today=Tradeoffs; © 2015 Intel corporation; www.intel.com/nvm; pp. 1.

* cited by examiner

*Primary Examiner* — Fernando Hidalgo
(74) *Attorney, Agent, or Firm* — McClure, Qualey & Rodack, LLP

(57) ABSTRACT

A memory device includes a memory unit and a selector. The memory unit is configured to store data. The selector is coupled to the memory unit, and has a variable electrical parameter capable of being set to different levels. When the variable electrical parameter of the selector is set to a first level, the selector is turned on in response to an operation signal that is enabled, allowing the data stored in the memory unit to be accessed; when the variable electrical parameter of the selector is set to a second level, the selector remains turned off when receiving the operation signal that is enabled, prohibiting the data stored in the memory unit from being accessed.

18 Claims, 6 Drawing Sheets

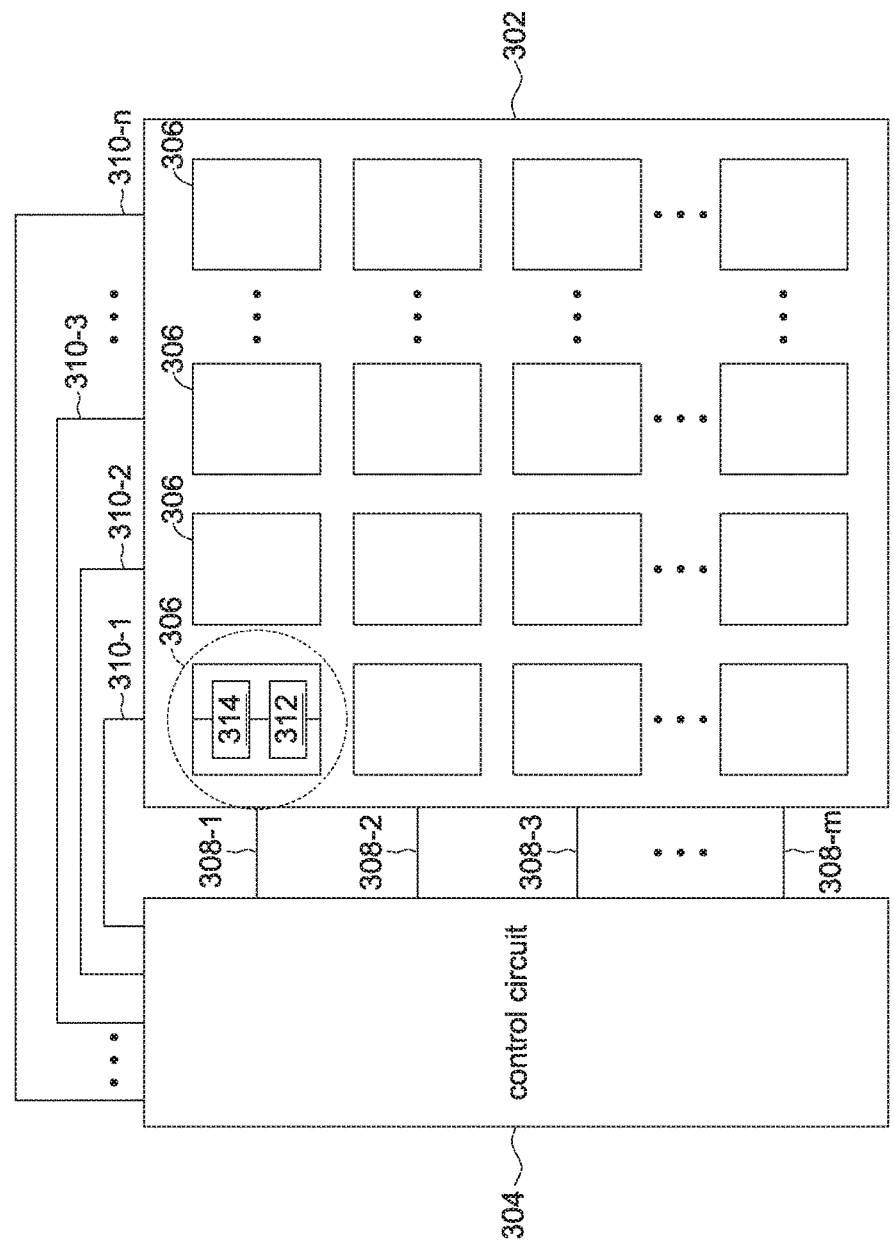

MEMORY DEVICE, SYSTEM AND OPERATING METHOD THEREOF

TECHNICAL FIELD

The present disclosure relates to a memory device, a memory system and an operating method thereof.

BACKGROUND

Resistive memories, such as resistive random access memories (ReRAM), have been widely used in various electric products. The resistive memory includes a plurality of memory cells, with each having a particular resistance to represent a stored data value, e.g., 0 or 1. Generally, a program operation performed on the memory cells of the resistive memory can be done by changing the resistances of the memory cells.

However, the resistive memory probably includes a few of memory cells that cannot be set to a predetermined resistance through the program operation, such that failure bits occur in the memory. Because these failure bits occur randomly and unpredictably, suppressing the impact of the failure bits becomes the key to improving the reliability of storage apparatus.

SUMMARY

The present disclosure relates to a memory device, a memory system and an operating method thereof. The memory device includes a memory unit and a selector. The selector has a variable electrical parameter capable of being set to different levels. When the variable electrical parameter of the selector is set to a first level, the selector is operated in an enabled state. In such cases, when the memory unit is selected, the selector is turned on, allowing the memory unit to be programed or read. On the other hand, when the variable electrical parameter of the selector is set to a second level, the selector is operated in a disabled state. In such cases, when the memory unit is selected, the selector remains turned off, prohibiting the memory unit from being accessed. By using the above characteristics, the control circuit may first identify the memory units that cannot be successfully programed from the memory array, and then set the selectors coupled to these memory units to the disabled state, so as to prevent the adverse impact of the failure bits on the storage apparatus. Further, once a selector is operated in the disabled state, the memory unit is operated in a very low leakage current condition. As a result, the impact of sneak path current can be avoided, and the power consumption can be improved.

According to an embodiment of the present disclosure, a memory device is provided. The memory device includes a memory unit and a selector. The memory unit is configured to store data. The selector is coupled to the memory unit, and has a variable electrical parameter capable of being set to different levels. When the variable electrical parameter of the selector is set to a first level, the selector is turned on in response to an operation signal that is enabled, allowing the data stored in the memory unit to be accessed; when the variable electrical parameter of the selector is set to a second level, the selector remains turned off when receiving the operation signal that is enabled, prohibiting the data stored in the memory unit from being accessed.

According to an embodiment of the present disclosure, a memory system is provided. The memory system includes a memory array and a control circuit. The memory array includes a plurality of memory devices, with each of the memory devices including a memory unit and a selector. The selector is coupled to the memory unit and has a variable electrical parameter capable of being set to different levels. The control circuit is coupled to the memory array and configured to access the memory units and set the variable electrical parameters of the selectors. When the variable electrical parameter of a particular selector of the selectors is set to a first level, the particular selector is turned on in response to an operation signal that is enabled, allowing data stored in a particular memory unit of the memory units that is coupled to the particular selector to be accessed; when the variable electrical parameter of the particular selector is set to a second level, the particular selector remains turned off when receiving the operation signal that is enabled, prohibiting the data stored in the particular memory unit from being accessed.

According to an embodiment of the present disclosure, an operating method of a memory system is provided. The memory system includes a memory array including a plurality of memory devices, with each of the memory devices including a memory unit and a selector, and the selector is coupled to the memory unit and has a variable electrical parameter capable of being set to different levels. The operating method includes: the memory units are read to determine whether the memory units pass a program operation; conditioned on determining that a particular memory unit of the memory units passes the program operation, the variable electrical parameter of a particular selector of the selectors that is coupled to the particular memory unit is set to a first level, so that the particular selector is turned on when receiving an operation signal that is enabled, allowing data stored in the particular memory unit to be accessed; and conditioned on determining that the particular memory unit fails to pass the program operation, the variable electrical parameter of the particular selector is set to a second level, so that the particular selector remains turned off when receiving the operation signal that is enabled, prohibiting the data stored in the particular memory unit from being accessed.

The details of one or more disclosed implementations are set forth in the accompanying drawings and the description below. Other features, aspects, and advantages will become apparent from the description, the drawings and the claims.

BRIEF DESCRIPTION OF THE DRAWINGS

FIG. 3A is a schematic diagram illustrating a memory system in accordance with an embodiment of the present disclosure.

Figure 1:
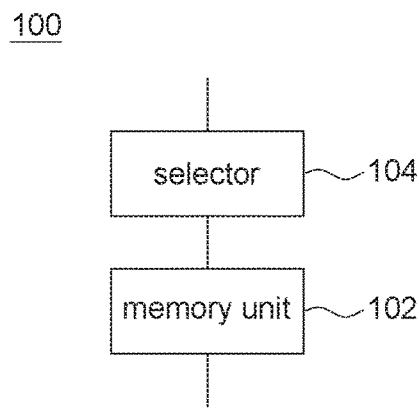
FIG. 1 is a schematic diagram illustrating a memory device in accordance with an embodiment of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

A number of embodiments are disclosed below for elaborating the invention. However, the embodiments of the invention are for detailed descriptions only, not for limiting the scope of protection of the invention. Furthermore, secondary or unimportant elements are omitted in the accompanying diagrams of the embodiments for highlighting the technical features of the invention.

FIG. 1 is a schematic diagram illustrating a memory device 100 in accordance with an embodiment of the present disclosure. The memory device 100 may act as a memory cell of a memory. The memory device 100 includes a memory unit 102 and a selector 104. The memory unit 102 is configured to store data (e.g., user data). The selector 104 is coupled to the memory unit 102. As shown in FIG. 1, the selector 104 is connected to the memory unit 102 in series, forming a "1S1R" cell structure. The selector 104 can be turned on or turned off. When the selector 104 is turned on, the memory unit 102 is allowed to be accessed by an external control circuit; when the selector 104 is turned off, the memory unit 102 is not allowed to be accessed by the external control circuit.

It is noted that although in FIG. 1 the selector 104 and the memory unit 102 are presented as the "1S1 R" cell structure, the present disclosure is not limited thereto. The memory device 100 may include one or more selectors 104 and one or more memory units 102, forming different cell structures, such as "2S1 R" cell structure.

The memory unit 102 may be any appropriate storage component. Taking ReRAM as an example, the memory unit 102 can be programmed to a particular resistance state (e.g., a high resistance state or a low resistance state) to represent a particular data value (e.g., 0 or 1). In such cases, the resistance state that represents a data value can be deemed as a data state of the memory unit 102.

According to embodiments of the present disclosure, the selector 104 has a variable electrical parameter capable of being set to different levels. When the variable electrical parameter of the selector 104 is set to a first level, the selector 104 is operated in an enabled state, in which the selector 104 is turned on in response to the enabled operation signal, allowing data in the memory unit 102 to be accessed. When the variable electrical parameter of the selector 104 is set to a second level, the selector 104 is operated in a disabled state, in which the selector 104 remains turned off when receiving the enabled operation signal, prohibiting the data in the memory unit 102 from being accessed.

In some embodiments, the operation signal refers to a signal for selecting a particular memory unit to be accessed, such as a word line voltage. When the operation signal received by the selector 104 is enabled, it means that the memory unit 102 coupled to the selector 104 is selected to be read or programed. Conversely, when the operation signal received by the selector 104 is disabled, it means that the memory unit 102 coupled to the selector 104 is not selected to be read or programed.

The variable electrical parameter of the selector 104 may be a threshold voltage, a turn-on resistance or any other appropriate electrical parameter, depending on the implementation of the selector 104.

In some embodiments, the selector 104 can be implemented by a transistor, a diode or any semiconductor structure that can switch its conduction state. For example, the selector 104 can be implemented by a transistor including a floating gate or a charge trapping structure. By changing the amount of charges on the floating gate or the charge trapping structure, the threshold voltage (i.e., the variable electrical parameter) of the selector 104 can be adjusted.

Figure 2A:
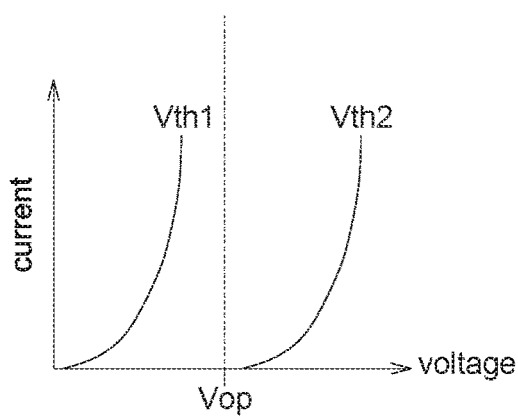
FIG. 2A illustrates a current-voltage characteristic diagram of the variable electrical parameter of the selector in accordance with an embodiment of the present disclosure.

FIG. 2A illustrates a current-voltage characteristic diagram of the variable electrical parameter of the selector 104 in accordance with an embodiment of the present disclosure. In the example of FIG. 2A, the variable electrical parameter of the selector 104 is a threshold voltage. The threshold voltage of the selector 104 can be set to a first level Vth1 or a second level Vth2 higher than the first level Vth1.

The voltage level of the enabled operation signal is Vop. Since Vop>Vth1, when the threshold voltage of the selector 104 is set to the first level Vth1, the selector 104 is turned on in response to the enabled operation signal. On the other hand, since Vop<Vth2, when the threshold voltage of the selector 104 is set to the second level Vth2, the selector 104 will remain in the OFF state, no matter whether the received operation signal is enabled or not.

Figure 2B:
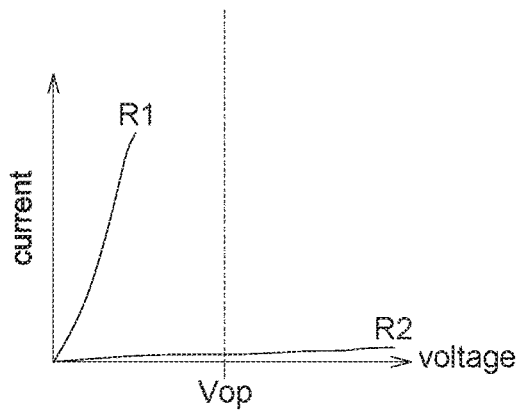
FIG. 2B illustrates a current-voltage characteristic diagram of the variable electrical parameter of the selector in accordance with another embodiment of the present disclosure.

FIG. 2B illustrates a current-voltage characteristic diagram of the variable electrical parameter of the selector 104 in accordance with another embodiment of the present disclosure. In the example of FIG. 2B, the variable electrical parameter of the selector 104 is a turn-on resistance. The turn-on resistance of the selector 104 can be set to a first level R1 or a second level R2 higher than the first level R1.

The voltage level of the enabled operation signal is Vop. When the turn-on resistance of the selector 104 is set to the first level R1, the selector 104 is turned on in response to the enabled operation signal. Conversely, when the turn-on resistance of the selector 104 is set to the second level R2, the selector 104 remains turned off, no matter whether the received operation signal is enabled or not.

Generally speaking, when the variable electrical parameter of the selector 104 is set to the first level, the selector 104 is operated in an enabled state; when the variable electrical parameter of the selector 104 is set to the second level, the selector 104 is operated in a disabled state. Under the enabled state, the selector 104 may switch its conduction state in response to the change of the operation signal. Therefore, the selector 104 can act as an addressing device that is turned on when the memory unit 102 is selected, allowing the memory unit 102 to be accessed. Under the disabled state, the selector 104 remains turned off, and will not be turned on by the received operation signal. As a result, the selector 104 blocks electrical operations (e.g., read and write) that the external control circuit performs on the memory unit 102.

FIG. 3A is a schematic diagram illustrating a memory system 300 in accordance with an embodiment of the present disclosure. The memory system 300 includes a memory array 302 and a control circuit 304.

The memory array 302 includes a plurality of memory devices 306, with each of the memory devices 306 including at least one of memory unit 312 and at least one selector 314. In one memory device 306, the memory unit 312 is used to store data, and the selector 314 is coupled the memory unit 312 and has a variable electrical parameter capable of being set to different levels.

The control circuit 304 is coupled to the memory array 302. The control circuit 304 may access the memory units 312 in the memory devices 306, and set the variable electrical parameter of each selector 314. The control circuit 304 may be a microcontroller, a microprocessor, an application-specific integrated circuit (ASIC) or any appropriate hardware circuit.

As shown in FIG. 3A, the control circuit 304 is connected to the memory array 302 through a plurality of word lines 308-1 to 308-m and a plurality of bit lines 310-1 to 310-n. The control circuit 304 may decode an access request, and perform electrical operations such as a read operation and a write (program) operation on a particular memory unit 312 at a particular location in the memory array 302 by applying appropriate bias voltages to the word lines 308-1 to 308-m and the bit lines 310-1 to 310-n.

Further, the control circuit 304 may individually set the variable electrical parameter of each selector 314. Therefore, different selectors 314 may be set to the enabled state or the disabled state. For example, the control circuit 304 may read the memory units 312 in the memory array 302 at first, so as to identify which memory unit 312 is a failure bit that cannot be programed successfully, and which memory unit 312 is a healthy bit that can be programed successfully.

The selector 314 coupled to the memory unit 312 of the failure bit will be set to the disabled state by the control circuit 304 (i.e., the variable electrical parameter is set to the second level). This not only prevents the failure bit from being accessed, but also reduces the leakage current caused by the failure bit.

On the other hand, the selector 314 coupled to the memory unit 312 of the healthy bit will be set to the enabled state by the control circuit 304 (i.e., the variable electrical parameter is set to the first level), so that the memory unit 312 of the healthy bit can be accessed under a normal electrical condition.

Figure 3B:
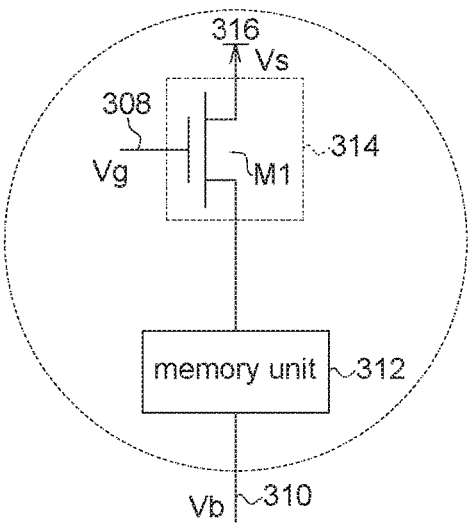
FIG. 3B is an example circuit diagram of the memory device.

FIG. 3B is an example circuit diagram of the memory device 306 shown in FIG. 3A. As shown in FIG. 3B, the memory device 306 includes a memory unit 312 and a selector 314. The memory unit 312 is coupled between a particular bit line 310 (e.g., one of the bit lines 310-1 to 310-n shown in FIG. 3A) and the selector 314.

The selector 314 includes a transistor M1. The transistor M1 includes a control terminal (e.g., a gate) coupled to a particular word line 308 (e.g., one of the word lines 308-1 to 308-m shown in FIG. 3A), a first terminal (e.g., a drain) coupled to the memory unit 312 and a second terminal (e.g., a source) coupled to a bias source 316. The word line 308 is configured to transmit the operation signal. When the operation signal applied on the word line 308 is enabled (e.g., with a high voltage level), it means that the memory device 306 coupled to the word line 308 is selected by the control circuit 304 for a further electrical operation. On the contrary, when the operation signal applied on the word line 308 is disabled (e.g., with a low voltage level), it means that the memory device 306 coupled to the word line 308 is unselected by the control circuit 304.

When the selector 314 is operated in the disabled state, the threshold voltage of the transistor M1 is set to the second level, so that the transistor M1 remains turned off, and will not be turned on by the enabled operation signal. In such cases, when the memory unit 312 is selected by the control circuit 304, the control circuit 304 detects only a very low current (or a very high resistance). This very low current is about 4 orders of magnitude less than a sensing current corresponding to a data state. Therefore, the control circuit 304 may recognize that the very low current is caused by the disabled state, and is irrelevant to the data state of the memory unit 312.

When the selector 314 is operated in the enabled state, the threshold voltage of the transistor M1 is set to the first level. In such cases, the transistor M1 responds the enabled operation signal to switch on, and responds the disabled operation signal to switch off. When the transistor M1 is turned on, the memory unit 312 is allowed to be accessed.

In an embodiment, the control circuit 304 may perform a hot carrier injection operation or a Fowler-Nordheim tunneling operation on the transistor M1, so that the threshold voltage of the transistor M1 is switched from the first level to the second level. The second level may be, for example, higher than the first level.

It is noted that although the memory device 306 is exemplified by the circuit structure illustrated in FIG. 3B, the present disclosure is not limited thereto. The memory devices described in various embodiments of present disclosure are suitably used as the memory devices 306 of the memory system 300.

Figure 4:
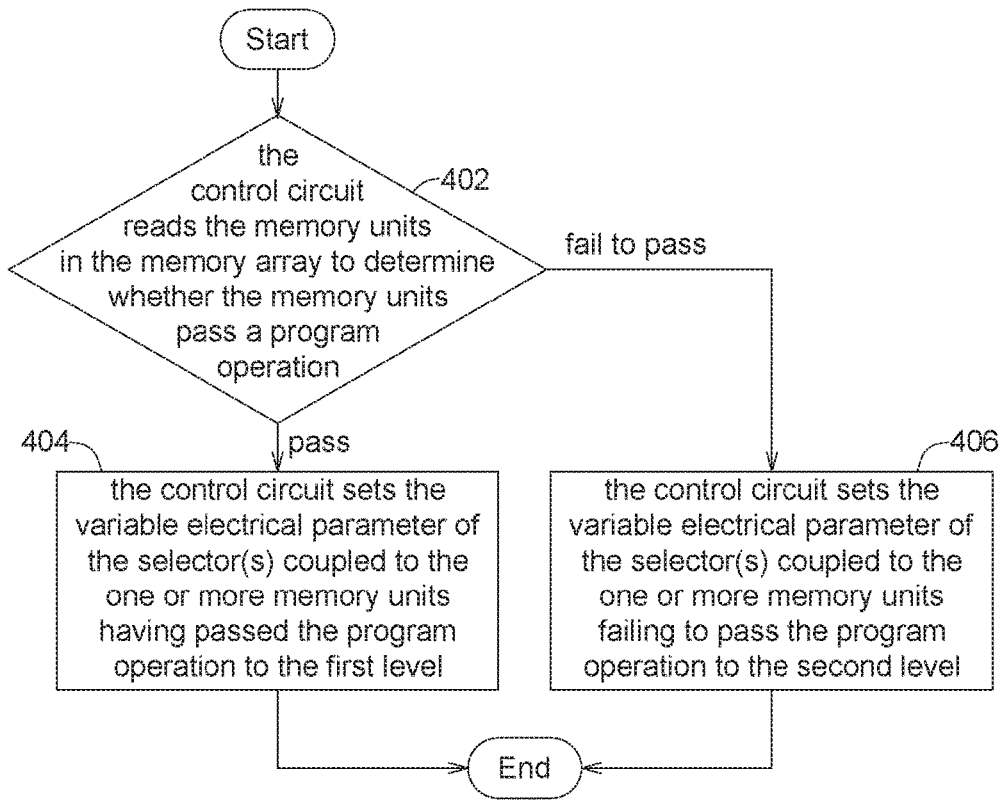
FIG. 4 is a flowchart illustrating an operating method of the memory system in accordance with an embodiment of the present disclosure.

FIG. 4 is a flowchart illustrating an operating method of the memory system 300 in accordance with an embodiment of the present disclosure.

In step 402, the control circuit 304 reads the memory units 312 in the memory array 302 to determine whether the memory units 312 pass a program operation.

The program operation may include one or more program steps for setting the memory unit 312 to a predetermined data state. If the memory unit 312 passes the program operation, it means that the memory unit 312 has been successfully programed to the predetermined data state through the program operation. The memory unit 312 that successfully passes the program operation is deemed as the healthy bit. On the contrary, if the memory unit 312 fails to pass the program operation, it means that the memory unit 312 fails to be programed to the predetermined data state through the program operation. The memory unit 312 that fails to pass the program operation is deemed as the failure bit.

In step 404, for one or more memory units 312 having passed the program operation (i.e., healthy bits), the control circuit 304 sets the variable electrical parameter of the selector(s) 314 coupled to the one or more memory units 312 having passed the program operation to the first level.

In step 406, for one or more memory units 312 failing to pass the program operation (i.e., failure bits), the control circuit 304 sets the variable electrical parameter of the selector(s) 314 coupled to the one or more memory units 312 failing to pass the program operation to the second level.

As discussed above, when the variable electrical parameter of the selector 314 is set to the first level, the selector 104 is operated in the enabled state, in which the selector 104 switches its conduction state in response to the change of the operation signal; when the variable electrical parameter of the selector 314 is set to the second level, the selector 104 is operated in the disabled state, in which the selector 104 remains turned off, and will not be turned on by the received operation signal.

In the above manner, the memory units 306 programmed unsuccessfully in the memory array 302 (i.e., failure bits) are not allowed to be accessed due to the disabled state of the selector 314. Accordingly, the adverse impact of the failure bits on the storage apparatus can be prevented. Moreover, once the selector 314 is set to the disable state, the selector 314 is equivalent to open. Therefore, the leakage current issue can be effectively addressed.

In an embodiment, the process flow of FIG. 4 can be performed during the manufacturing process to set the failure bits in the memory array to the disabled state in advance. In another embodiment, the control circuit 304 may, cyclically or in response to a trigger event, perform the process flow shown in FIG. 4.

For better illustration, an exemplary and non-limiting embodiment is described in greater detail below in connection with FIGS. 5 and 6A-6C.

Figure 5:
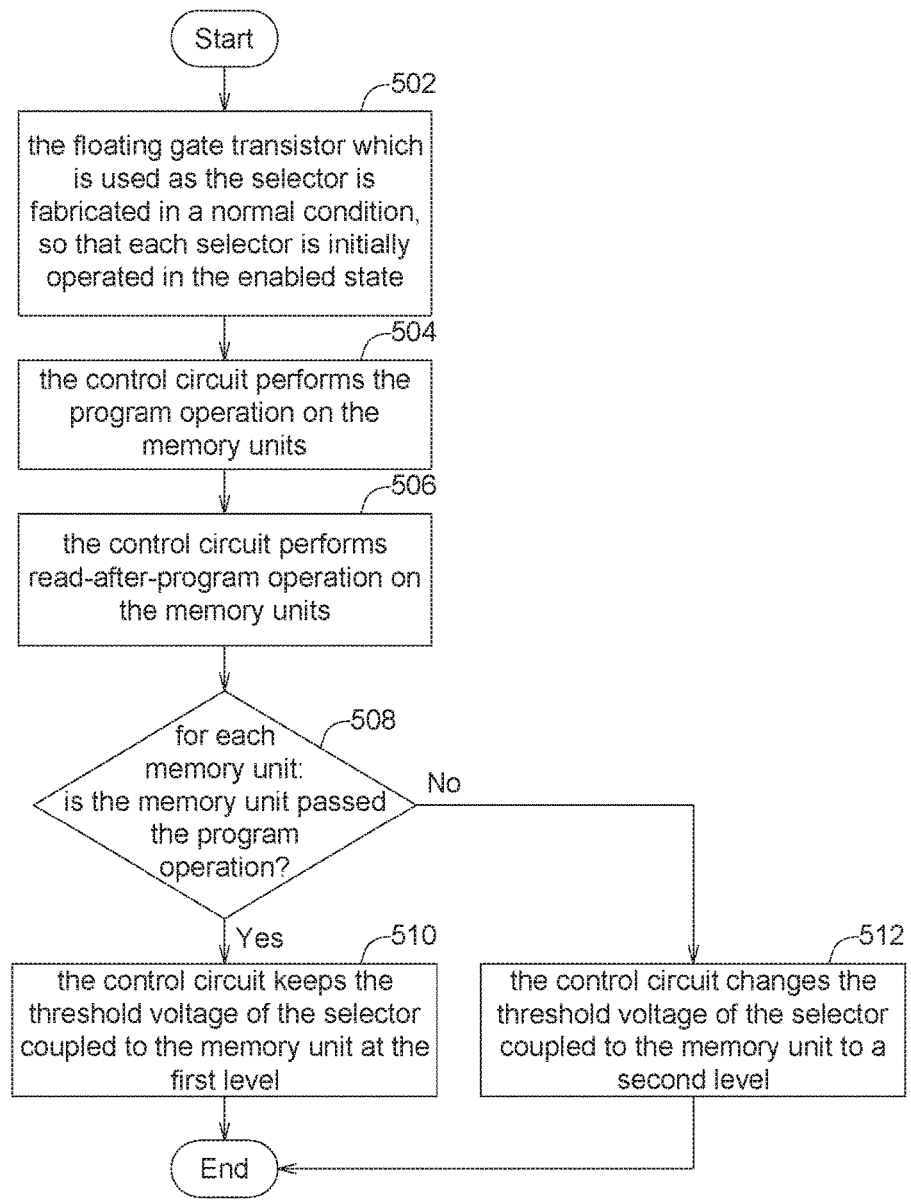
FIG. 5 is a flowchart illustrating an operating method of the memory system in accordance with an embodiment of the present disclosure.
Figure 6A:
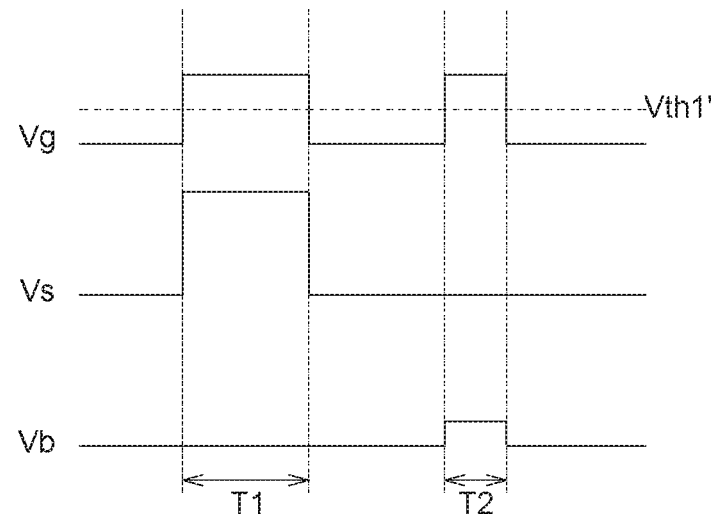
FIGS. 6A-6C illustrate operation waveforms of the memory system in accordance with an embodiment of the present disclosure.
Figure 6B:
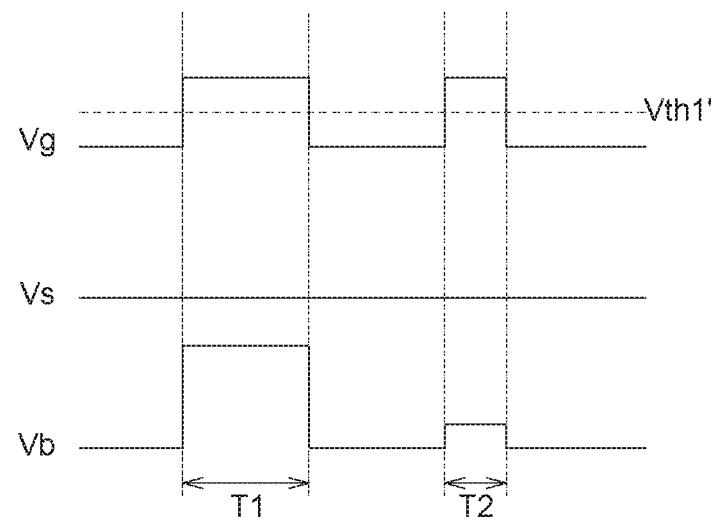
Figure 6C:
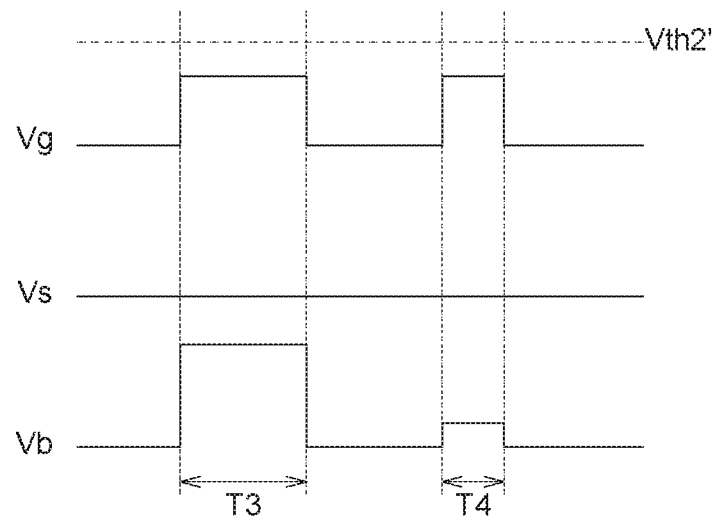

FIG. 5 is a flowchart illustrating an operating method of the memory system 300 in accordance with an embodiment of the present disclosure. FIGS. 6A-6C illustrate operation waveforms of the memory system 300 in accordance with an embodiment of the present disclosure. In this example, the memory device 306 is implemented by the circuit structure shown in FIG. 3B, wherein the transistor M1 is, for example, a floating gate transistor, and the memory unit 312 is a storage component of a resistive memory.

As shown in FIG. 5, in step 502, the floating gate transistor which is used as the selector 314 is fabricated in a normal condition, so that each selector 314 are initially operated in the enabled state. In such cases, the variable electrical parameter (i.e., the threshold voltage) of each selector 314 is set to the first level, e.g., about 0.6 volts.

In step 504, the control circuit 304 performs the program operation on the memory units 312. The program operation includes, for example, an operation for programming the memory unit 312 to a "SET" state, and/or an operation for programming the memory unit 312 to a "RESET" state.

Referring to FIGS. 3B and 6A, if the program operation is to program the SET state, during the first period of time T1, the control circuit 304 sets the voltage Vg on the word line 308 to a voltage level (e.g., 1.2 volts) higher than the first level, and sets the voltage Vs of the bias source 316 to 1.5 volts or higher. Under the bias condition, the selector 314 is turned on, and the memory unit 312 is programed to the SET state.

Referring to FIGS. 3B and 6B, if the program operation is to program the RESET state, during the first period of time T1, the control circuit 304 sets the voltage Vg on the word line 308 to a voltage level (e.g., 1.2 volts) higher than the first level, and sets the voltage Vb of the bit line 310 to 1.5 volts or higher. Under the bias condition, the selector 314 is turned on, and the memory unit 312 is programed to the RESET state.

In step 506, the control circuit 304 performs read-after-program operation on the memory units 312. In step 508, the control circuit 304 determines whether the program operation is passed for each memory unit 312 individually.

Referring to FIGS. 3B and 6A again, if in step 504 the program operation is to program the SET state, during the second period of time T2, the control circuit 304 sets the voltage Vg to a voltage level (e.g., 1.2 volts) higher than the first level Vth1', and sets the voltage Vb to a low level, e.g., 0.1/0.3/0.5 volts. Under the bias condition, the selector 314 is turned on, and the memory unit 312 is read. The control circuit 304 may determine whether the memory unit 312 is at a low resistance corresponding to the SET state, e.g., 30 Kohm, according to the magnitude of the sensing current. For example, once the control circuit 304 detects that the magnitude of the sensing current is about 20-50 µA, the control circuit 304 determines that the memory unit 312 has been programed to the SET state successfully. Otherwise, it is determined that the memory unit 312 fails to pass the program operation.

Referring to FIGS. 3B and 6B again, if in step 504 the program operation is to program the RESET state, during the second period of time T2, the control circuit 304 sets the voltage Vg to a level (e.g., 1.2 volts) that is higher than the first level Vth1', and sets the voltage Vb to a low level, e.g., 0.1/0.3/0.5 volts. Under the bias condition, the selector 314 is turned on, and the memory unit 312 is read. The control circuit 304 may determine whether the memory unit 312 is at a high resistance corresponding to the RESET state, e.g., 100 Kohm, according to the magnitude of the sensing current. For example, once the control circuit 304 detects that the magnitude of the sensing current is about 1-5 pA, the control circuit 304 determines that the memory unit 312 has been programed to the RESET state successfully. Otherwise, it is determined that the memory unit 312 fails to pass the program operation.

In step 510, conditioned on determining that a memory unit 312 passes the program operation, the control circuit 304 keeps the threshold voltage of the selector 314 coupled to the memory unit 312 at the first level Vth1'. That is, when a memory unit 312 is deemed as a healthy bit, the selector 314 coupled to the memory unit 312 will be operated in the enabled state.

In step 512, conditioned on determining that a memory unit 312 fails to pass the program operation, the control circuit 304 changes the threshold voltage of the selector 314 coupled to the memory unit 312 to a second level. That is, when a memory unit 312 is deemed as a failure bit, the selector 314 coupled to the memory unit 312 will be operated in the disabled state.

In an embodiment, the control circuit 304 may perform the hot carrier injection operation at the second terminal (i.e., source side) of the transistor M1, so that the threshold voltage of the selector 314 is raised to the second level, e.g., 1.8 volts.

Referring to FIG. 6C, after the selector 314 enters the disabled state, the threshold voltage of the selector 314 is set to a second level Vth2' higher than the word line voltage Vg. Thus, even though the voltage Vg is enabled during a third period of time T3 (i.e., a program interval) and a fourth period of time T4 (i.e., a read interval), the transistor M1 remains turned off, so that the control circuit 304 detects only a very low sensing current, about several nA to several pA.

Figure 7:
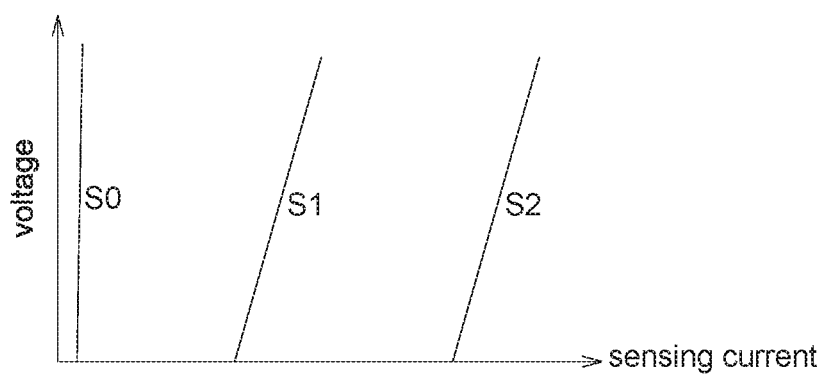
FIG. 7 is a schematic diagram illustrating the data states of the memory unit in according to an embodiment of the present disclosure.

FIG. 7 is a schematic diagram illustrating the data states of the memory unit 312 in according to an embodiment of the present disclosure.

As discussed above, the control circuit 304 may determine the data state of the memory unit 312 according to the sensing current. In this example, the memory unit 312 operationally has two possible data states, S1 and S2, with each data state representing a particular data value (e.g., 0 or 1). Once the selector 314 coupled to the memory unit 312 is turned off, the control circuit detects only a very low current (compared to the sensing current corresponding to the data state) when reading the memory unit 312 with a normal electrical condition. Therefore, a disabled state S0 can be identified by the control circuit 304. The disabled state S0 will not be recognized as a data state for indicating a particular data value. In other words, when the memory unit 312 is selected, the selector 314 coupled to the memory unit 312 may introduce the disabled state S0 irrelevant to the stored data by changing the variable electrical parameter. Under the disabled state S0, the memory unit 312 cannot be accessed by normal electrical conditions.

It is noted that although in FIG. 7 the memory unit 312 includes only two possible data states S1 and S2, the present disclosure is not limited thereto. In some embodiments, the memory unit 312 may include more than two possible data states, such as four possible data states.

Based on the above, the proposed memory device includes a memory unit and a selector. The selector has a variable electrical parameter capable of being set to different levels. When the variable electrical parameter of the selector is set to a first level, the selector is operated in an enabled state. In such cases, when the memory unit is selected, the selector is turned on, allowing the memory unit to be programed or read. On the other hand, when the variable electrical parameter of the selector is set to a second level, the selector is operated in a disabled state. In such cases, when the memory unit is selected, the selector remains turned off, prohibiting the memory unit from being accessed. By using the above characteristics, the control circuit may first identify the memory units that cannot be successfully programmed from the memory array, and then set the selectors coupled to these memory units to the disabled state, so as to prevent the adverse impact of the failure bits on the storage apparatus. Further, once a selector is operated in the disabled state, the memory unit is operated in a very low leakage current condition. As a result, the impact of sneak path current can be avoided, and the power consumption can be improved.

It will be clear to those skilled in the art that various modifications and variations could be made to the disclosed exemplary embodiments. It is intended that the specification and examples be considered as exemplary only, with a true scope of the disclosure being indicated by the following claims and their equivalents.

What is claimed is:

1. A memory device, comprising:
   a memory unit configured to store data; and
   a selector coupled to the memory unit, the selector having a variable electrical parameter capable of being set to different levels;
   wherein when the variable electrical parameter of the selector is set to a first level, the selector is turned on in response to an operation signal that is enabled, allowing the data stored in the memory unit to be accessed; when the variable electrical parameter of the selector is set to a second level, the selector remains turned off when receiving the operation signal that is enabled, prohibiting the data stored in the memory unit from being accessed;
   wherein the variable electrical parameter of the selector is set to the second level when the memory unit fails to pass a program operation.

2. The memory device according to claim 1, wherein the selector comprises a transistor, the variable electrical parameter is a threshold voltage of the transistor, the transistor comprises a control terminal coupled to a word line, a first terminal coupled to the memory unit and a second terminal coupled to a bias source, and the word line is configured to transmit the operation signal; and
   when the threshold voltage of the transistor is set to the second level, the transistor is turned off, and is not turned on by the operation signal.

3. The memory device according to claim 2, wherein when the threshold voltage of the selector is set to the first level, the transistor is turned on in response to the operation signal that is enabled, and is turned off in response to the operation signal that is disabled.

4. The memory device according to claim 2, wherein a hot carrier injection operation or a Fowler-Nordheim tunneling operation is performed on the transistor, so that the threshold voltage of the transistor is switched from the first level to the second level.

5. The memory device according to claim 2, wherein the second level of the threshold voltage of the transistor is higher than the first level.

6. The memory device according to claim 1, wherein the selector is a floating gate transistor or a diode.

7. A memory system, comprising:
   a memory array comprising a plurality of memory devices, with each of the memory devices comprising:
   a memory unit; and
   a selector coupled to the memory unit, the selector having a variable electrical parameter capable of being set to different levels; and
   a control circuit coupled to the memory array, configured to access the memory units and set the variable electrical parameters of the selectors;
   wherein when the variable electrical parameter of a particular selector of the selectors is set to a first level, the particular selector is turned on in response to an operation signal that is enabled, allowing data stored in a particular memory unit of the memory units that is coupled to the particular selector to be accessed; when the variable electrical parameter of the particular selector is set to a second level, the particular selector remains turned off when receiving the operation signal that is enabled, prohibiting the data stored in the particular memory unit from being accessed;
   wherein the control circuit is further configured to:
   read the memory units to determine whether the memory units pass a program operation; and
   for a first memory unit of the memory units that fails to pass the program operation, set the variable electrical parameter of a first selector of the selectors that is coupled to the first memory unit to the second level.

8. The memory system according to claim 7, wherein the particular selector comprises a transistor, the variable electrical parameter is a threshold voltage of the transistor, the transistor comprises a control terminal coupled to a word line, a first terminal coupled to the particular memory unit and a second terminal coupled to a bias source, and the word line is configured to transmit the operation signal; and
   when the threshold voltage of the transistor is set to the second level, the transistor is turned off, and is not turned on by the operation signal.

9. The memory system according to claim 8, wherein when the threshold voltage of the selector is set to the first level, the transistor is turned on in response to the operation signal that is enabled, and is turned off in response to the operation signal that is disabled.

10. The memory system according to claim 8, wherein the control circuit is further configured to perform a hot carrier injection operation or a Fowler-Nordheim tunneling operation on the transistor, so that the threshold voltage of the transistor is switched from the first level to the second level.

11. The memory system according to claim 8, wherein the second level of the threshold voltage of the transistor is higher than the first level.

12. The memory system according to claim 7, wherein the particular selector is a floating gate transistor or a diode.

13. The memory system according to claim 7, wherein the control circuit is further configured to:
  for a second memory unit of the memory units that passes the program operation, set the variable electrical parameter of a second selector of the selectors that is coupled to the second memory unit to the first level.

14. An operating method of a memory system, wherein the memory system comprises a memory array comprising a plurality of memory devices, with each of the memory devices comprising a memory unit and a selector, and the selector is coupled to the memory unit and has a variable electrical parameter capable of being set to different levels, comprising:
  reading the memory units to determine whether the memory units pass a program operation;
  conditioned on determining that a particular memory unit of the memory units passes the program operation, setting the variable electrical parameter of a particular selector of the selectors that is coupled to the particular memory unit to a first level, so that the particular selector is turned on when receiving an operation signal that is enabled, allowing data stored in the particular memory unit to be accessed; and
  conditioned on determining that the particular memory unit fails to pass the program operation, setting the variable electrical parameter of the particular selector to a second level, so that the particular selector remains turned off when receiving the operation signal that is enabled, prohibiting the data stored in the particular memory unit from being accessed.

15. The operating method according to claim 14, wherein the particular selector comprises a transistor, the variable electrical parameter is a threshold voltage of the transistor, the transistor comprises a control terminal coupled to a word line, a first terminal coupled to the particular memory unit and a second terminal coupled to a bias source, and the word line is configured to transmit the operation signal, and the operating method further comprises:
  conditioned on determining that the particular memory unit fails to pass the program operation, setting the threshold voltage of the transistor to the second level, so that the transistor is turned off when receiving the operation signal that is enabled.

16. The operating method according to claim 15, further comprising:
  conditioned on determining that the particular memory unit passes the program operation, setting the threshold voltage of the transistor to the first level, so that the transistor is turned on in response to the operation signal that is enabled, and is turned off in response to the operation signal that is disabled.

17. The operating method according to claim 15, wherein the second level of the threshold voltage of the transistor is higher than the first level.

18. The operating method according to claim 14, further comprising:
  performing a hot carrier injection operation or a Fowler-Nordheim tunneling operation on the transistor, so that the threshold voltage of the transistor is switched from the first level to the second level.

* * * * *